(12) United States Patent
Roberts et al.

(10) Patent No.: US 6,852,473 B2
(45) Date of Patent: Feb. 8, 2005

(54) ANTI-REFLECTIVE COATING CONFORMALITY CONTROL

(75) Inventors: William Roberts, Mechanicsville, VA (US); Marlene Strobl, Dresden (DE); Paul Williams, Goldcliff Newport (GB); Douglas J. Guerrero, Rolla, MO (US); Alice F. Martin, Rolla, MO (US)

(73) Assignees: Infineon Technologies Richmond, LP, Sandston, VA (US); Brewer Science Incorporated, Rolla, MO (US)

( * ) Notice: Subject to any disclaimer, the term of this patent is extended or adjusted under 35 U.S.C. 154(b) by 52 days.

(21) Appl. No.: 10/424,312

(22) Filed: Apr. 28, 2003

(65) Prior Publication Data

US 2004/0058278 A1 Mar. 25, 2004

Related U.S. Application Data

(63) Continuation-in-part of application No. 09/757,144, filed on Jan. 9, 2001, now abandoned.
(60) Provisional application No. 60/175,729, filed on Jan. 12, 2000.

(51) Int. Cl.$^7$ .............................. G03C 5/00; B01F 15/04
(52) U.S. Cl. .................... 430/315; 430/271.1; 430/311; 366/160.2; 366/144
(58) Field of Search .............................. 430/271.1, 311, 430/313, 315; 366/144, 160.2

(56) References Cited

U.S. PATENT DOCUMENTS

| | | | |
|---|---|---|---|
| 3,960,688 A | 6/1976 | Calbo, Jr. | |
| 5,001,107 A | 3/1991 | Bunker et al. | |
| 5,919,599 A | 7/1999 | Meador et al. | |
| 6,025,222 A | 2/2000 | Kimura et al. | |
| 6,056,527 A | 5/2000 | Bunyan et al. | |
| 6,346,361 B1 | 2/2002 | Shan et al. | |
| 6,653,049 B2 * | 11/2003 | Pavelchek et al. | 430/272.1 |

* cited by examiner

Primary Examiner—Rosemary Ashton
(74) Attorney, Agent, or Firm—Brinks Hofer Gilson & Lione

(57) ABSTRACT

A method for forming an anti-reflective coating on a semiconductor substrate, including providing a first vessel containing an anti-reflective coating component and a second vessel containing a solvent. The anti-reflective coating component from the first vessel and the solvent from the second vessel are supplied to a mixing chamber. The anti-reflective coating component and the solvent are mixed in the mixing chamber to form a product. The product is transferred to the semiconductor substrate. The product is applied to the semiconductor substrate to form the anti-reflective coating. A system for forming an anti-reflective coating on a semiconductor substrate, including a first vessel for containing an anti-reflective coating component and a second vessel for containing a solvent. The system also includes a mixing chamber for mixing the anti-reflective coating component with the solvent to form a product, and a fluid transport system connecting the mixing chamber and the substrate for supplying the product from the mixing chamber to the semiconductor substrate to form the anti-reflective coating.

20 Claims, 9 Drawing Sheets

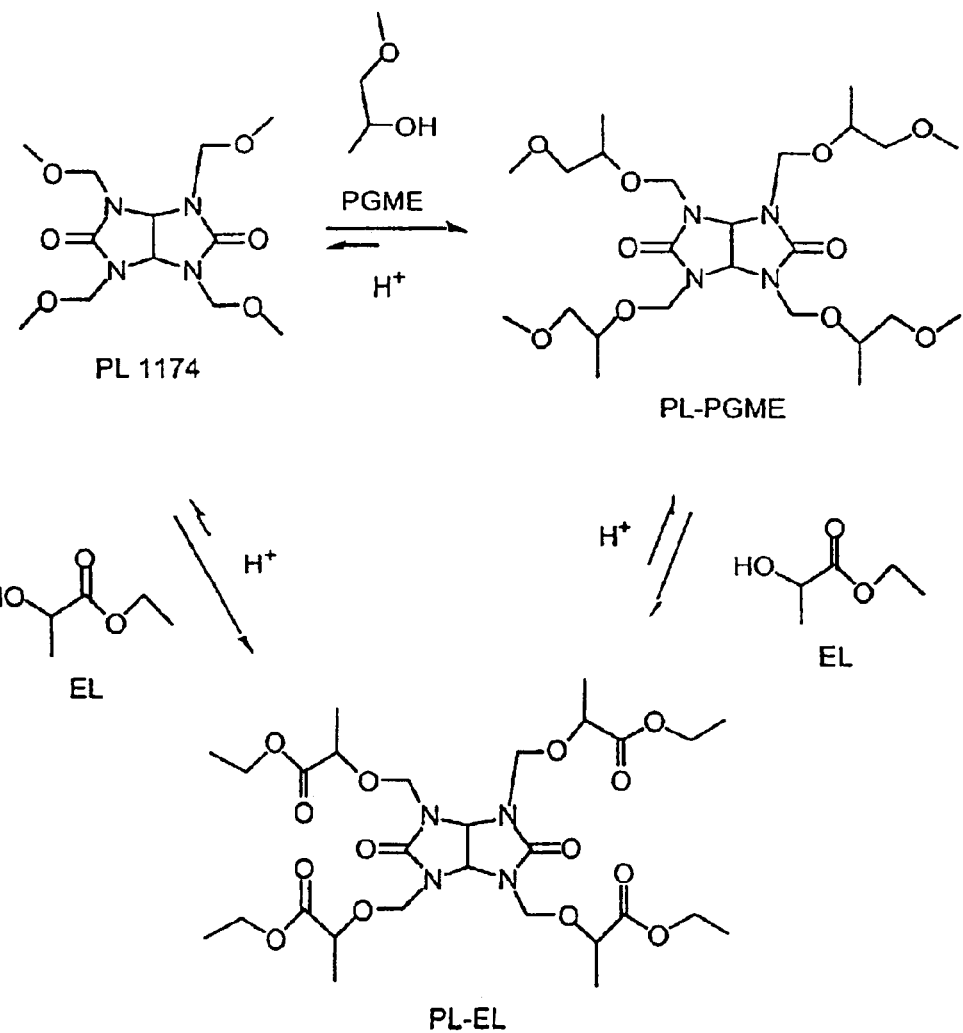
All reactions are catalyzed by acid (p-TSA).

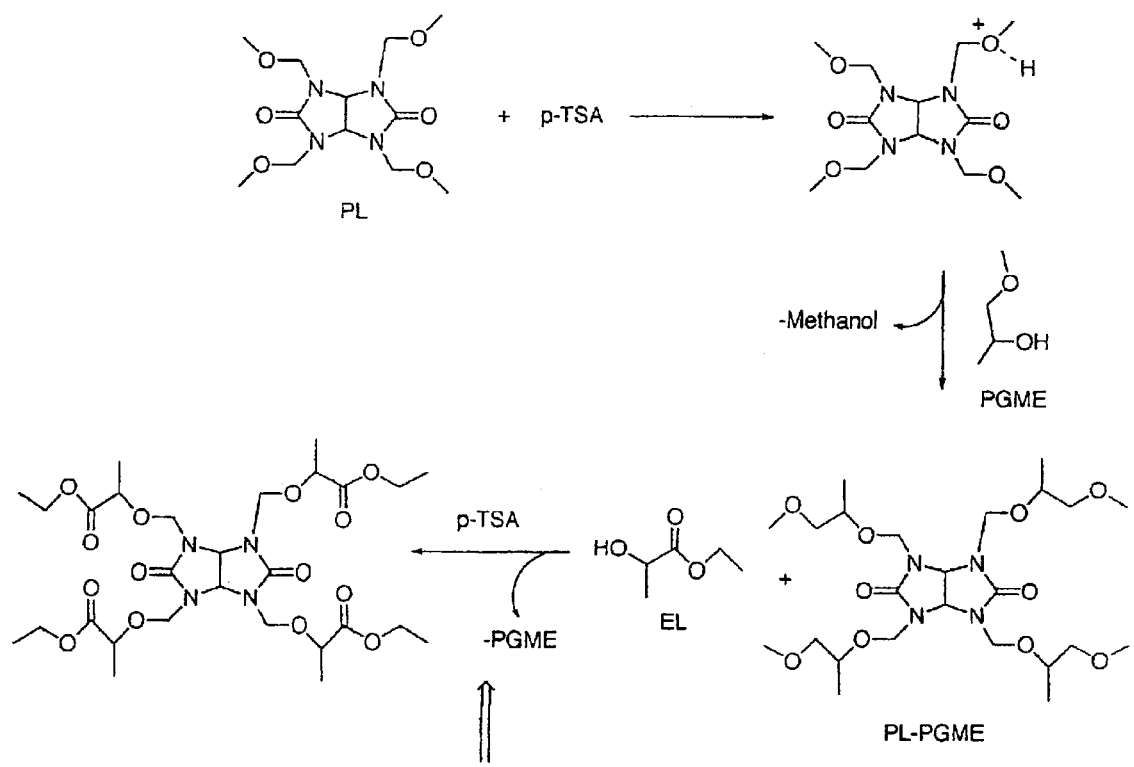

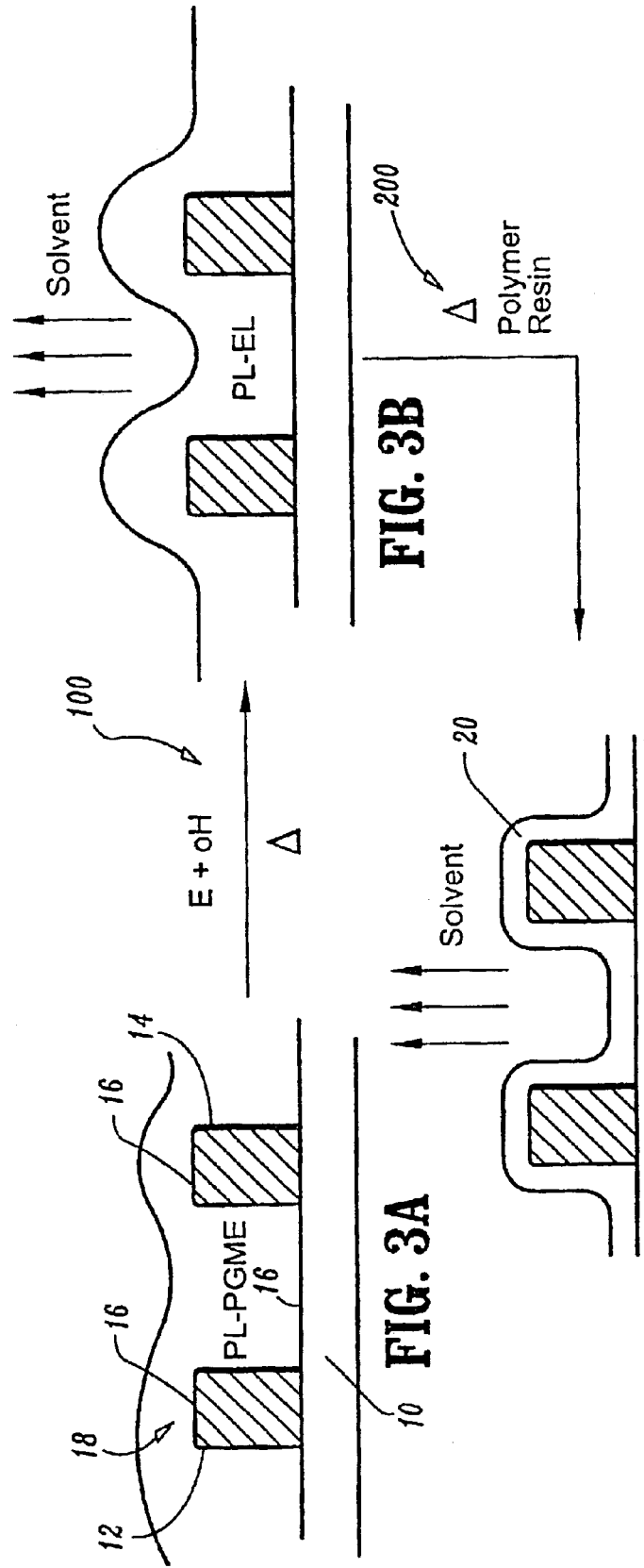

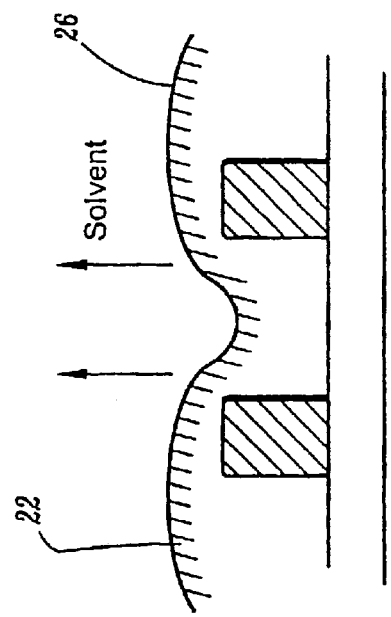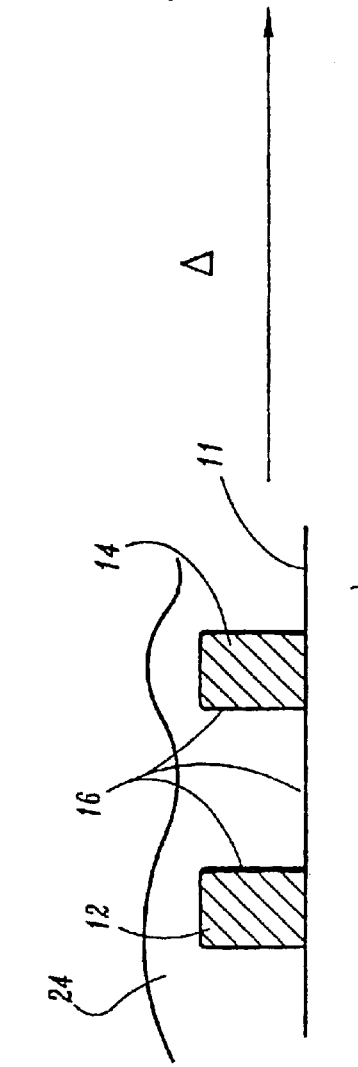

ANTI-REFLECTIVE COATING CONFORMALITY CONTROL

CROSS REFERENCE TO RELATED APPLICATION

This application is a continuation-in-part of U.S. patent application Ser. No. 09/757,144, filed on Jan. 9, 2001, now abandoned, which claims priority to Provisional Application Ser. No. 60/175,729, filed on Jan. 12, 2000.

TECHNICAL FIELD OF THE INVENTION

This invention relates to organic chemicals for manufacturing and more particularly to chemical delivery methods, and even more particularly to property control through delivery methods.

BACKGROUND OF THE INVENTION

Manufacturers in the semiconductor industry use organic materials for various fabrication steps. For example, bottom anti-reflective coatings (BARC) are used in photolithography steps to suppress reflections caused by light reflected from underlying layers, thus facilitating accurate resolution of small features. For this type of application, the BARC needs to provide conformal coverage of underlying features. In certain other applications, BARC can also serve a dual role as a planarizing layer and an anti-reflective coating. An example of a BARC is DUV 30, available from Brewer Science, Inc., located in Rolla, Mo.

Currently, one approach for providing a BARC is to synthesize a chromophore-linked novalac polymer, a cross-linker, and an appropriate solvent system. The manufacturer adds solvent to obtain the BARC viscosity necessary for producing the final thickness required by the customer's application. The manufacturer then hermetically seals the BARC within a bottle and ships it to the customer. The photolithography engineer obtains the final material form of the BARC by extracting material from the bottle, coating the substrate with the material, and baking the substrate. The organic BARC must be of appropriate thickness and optical density to actively suppress the reflective interference effects of the underlying films. In some applications, the BARC film is used to fill contact holes within a dielectric layer to an appropriate level to protect the substrate junctions during a dry etch for opening the BARC and a main etch.

More specifically, the photolithography engineer receives a package containing a BARC material. The BARC comprises a polymer component and a cross-linker component in a solvent:

(A) polymer component + cross linker component $\xrightarrow{\text{solvent}}$ BARC The polymer component is obtained, for example, by combining a polymer backbone, such as an epoxy novalac resin, and an actinic chromophore (see U.S. Pat. No. 5,919,598, the contents of which are incorporated herein by reference):

(B) novalac epoxy resin+actinic chromophore→polymer component

Typically, the polymer component has a chromophore bonded to the backbone, or as part of the backbone design.

An example of a cross-linker component is formed by dissolving POWDERLINK® 1174 (PL 1174, commercially available from Cytec Industries Inc., located in West Paterson, N.J.) in 1-methoxy-2-propanol, and adding toluenesulfonic acid (p-TSA.H$_2$O). The package includes PL 1174, p-TSA.H20, and alcoholic solvents such as PGME and Ethyl Lactate (EL)(see U.S. Pat. No. 5,919,599, the contents of which are incorporated herein by reference):

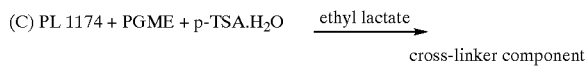

(C) PL 1174 + PGME + p-TSA.H$_2$O $\xrightarrow{\text{ethyl lactate}}$ cross-linker component FIG. 1 illustrates acid catalyzed reaction pathways in which PL and the solvents participate. The resulting mixture of PL, PL-PGME, and PL-EL adducts, shown in FIG. 1, form in solution. When the BARC formulation is applied to the silicon substrate and baked to elevated temperatures (100–220° C.), the crosslinker adducts further react with the polymer.

This combination of the cross linker component and the polymer component with a solvent is the form of the BARC needed by photolithography engineers. The chemical manufacturer may add solvents to the mixture, such as ethyl lactate, 1-methoxy-2-propanol, cyclohexanone, and n-methyl-pyrrolidone (NMP), to adjust the percentage of solids and to control the casting characteristics of the BARC, as well as to control the viscosity, and thereby control the thickness of the BARC layer when the BARC is used to coat a substrate.

It has recently been determined that in the presence of PGME and EL, the protonated PL produces PL-solvent adducts that have different structures, energies and reactivities than the starting crosslinker. FIG. 2 is a reaction scheme representing the reaction sequence in the formation of PL-PGME, and further PL-EL adducts. In the presence of p-TSA, PL will react with PGME, this intermediate further reacts to form a PL-EL adduct which is a lower energy more stable intermediate. The changes in crosslinker reactivity can be advantageously used to affect the type of coverage, e.g., conformal or planar, on the substrate.

SUMMARY OF THE INVENTION

The invention is based on the principle of controlling the point at which cross-linker starting materials (e.g. PL 1174, PGME, p-TSA.H$_2$O) are introduced to a solvent (e.g. ethyl lactate). The starting materials are delivered to a wafer fabrication facility separately, and then mixed with solvent, with or without artificial aging through mechanical means or heat. This procedure, thereby, provides the advantage of enabling the photolithography engineer to control output parameters. Also, the same starting materials can be used to produce both conformal and planarizing coatings. This discovery provides the advantage of eliminating the need for a fabrication facility to support multiple coating systems to obtain the required degrees of conformality and planarization. The invention provides a novel lithographic method for the formulation and delivery of a thin anti-reflective film with user-defined characteristics to a silicon wafer, on demand, with minimal set-up and conversion time through existing delivery system technology. The invention includes a procedure and a system for controlling the degree of conformality of an organic anti-reflective film coating. The conformality of an anti-reflective coating can be changed by changing the procedure in which the material formulation is completed and the sequencing of time and temperature. The anti-reflective material is mixed with an appropriate quantity of solvent, at an appropriate ratio to produce a desired viscosity. The product of either the as-mixed material or the aged material is then coated on to the surface of a substrate to produce a conformal coating or a planarized coating. If the product, without further treatment, is applied to a substrate, one obtains a conformal anti-reflective film coating which fills vias very poorly. If the product is aged before being applied to the substrate, the characteristics of the solution are permanently changed. The new characteristics produce planarizing coatings which are capable of filling vias completely. The degree of filling can be controlled through various conditions of aging.

According to an aspect of the invention, a method for delivering a chemical to a substrate includes the following steps. A first vessel is provided for containing a first component of the chemical and a second vessel is provided for containing a second component of the chemical. The first component from the first vessel and the second component from the second vessel are supplied to a mixing chamber. The first and second components are mixed in the mixing chamber to form the chemical and the chemical is transferred from the mixing chamber to the substrate.

In another aspect of the invention, a system for delivering a chemical to a substrate includes a first vessel for containing a first component of the chemical, a second vessel for containing a second component of the chemical, a mixing chamber for mixing the first and second components to form the chemical, and a fluid transport system connecting the mixing chamber and the substrate for transferring the chemical from the mixing chamber to the substrate.

In another aspect of the invention, a method for forming an anti-reflective coating on a semiconductor substrate comprises providing a first vessel containing an BARC coating component, providing a second vessel containing a solvent, supplying the BARC component from the first vessel and the solvent from the second vessel to a mixing chamber, mixing the BARC component and the solvent in the mixing chamber to form a product, transferring the product to the semiconductor substrate, and applying the product to the semiconductor substrate to form the anti-reflective coating.

Embodiments of the above aspects of the invention may include one or more of the following. The anti-reflective coating is a conformal coating. The anti-reflective coating has a degree of conformality and the degree of conformality is controlled by controlling a time between mixing the anti-reflective coating component and the solvent. The anti-reflective coating is a planarizing coating. The same anti-reflecting coating component and solvent is used to form a planarizing or conformal anti-reflective coating. The product is heated before it is transferred to the substrate. The anti-reflective coating has a degree of conformality and the degree of conformality is controlled by heating the product before transferring the product to the substrate. The product is transferred to the semiconductor substrate by a pump.

Another aspect of the invention features a system for forming an anti-reflective coating on a semiconductor substrate. The system includes a first vessel for containing an anti-reflective coating component, and a second vessel for containing a solvent. It also includes a mixing chamber for mixing the anti-reflective coating component with the solvent to form a product and a fluid transport system connecting the mixing chamber and the substrate for supplying the product from the mixing chamber to the semiconductor substrate to form the anti-reflective coating.

Embodiments of this aspect of the invention may include one or more of the following. The anti-reflective coating is a conformal coating. The anti-reflective coating is a planarizing coating. The same anti-reflective coating component and solvent are used to form the coating, with the coating being either planarizing or conformal anti-reflective coating. The system also includes a heat exchanger for heating the product before transferring the product to the substrate. The system also includes a pump for transferring the product to the semiconductor substrate.

An advantage of an aspect of the invention is that it provides a method for forming conformal and planarizing films with a single product. The method provides an infinite range of film characteristics, with user-defined set-up properties. It enables significant process flexibility for manufacturing, not requiring tool-specific product. Conversion time lines for new product changeover can be accomplished in minutes.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a reaction scheme representing the formation of crosslinker-solvent adducts.

FIG. 2 is a reaction scheme representing the reaction sequence in the formation of PL-PGME, and further PL-EL adducts.

FIGS. 3A–3C are schematic cross-sectional views of a conformal anti-reflective coating formed on a substrate.

FIGS. 4A–4B are schematic cross-sectional views of a planarizing anti-reflective coating formed on a substrate.

Like reference symbols in the various drawings indicate like elements.

DETAILED DESCRIPTION

Figure 5:
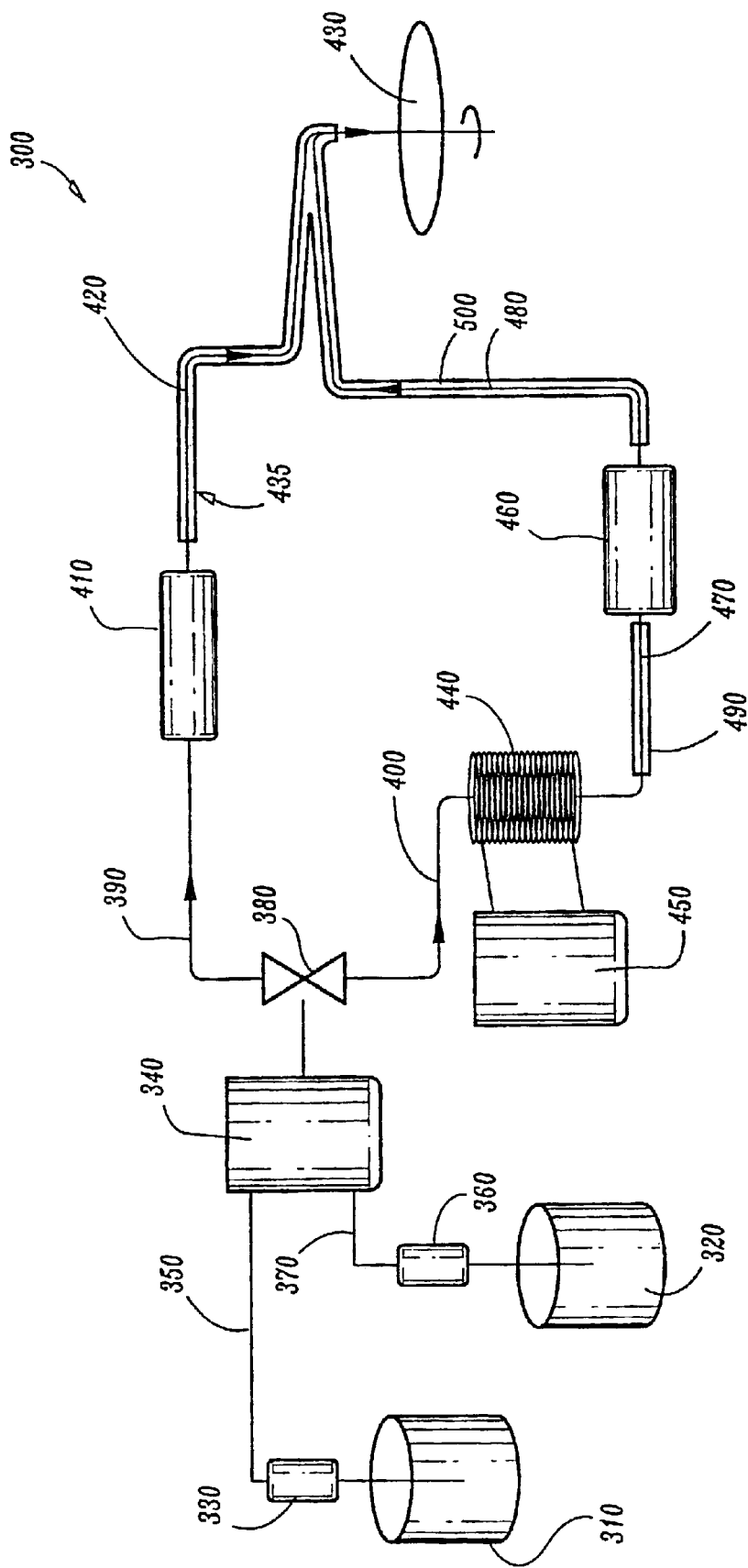
FIG. 5 is a schematic diagram of a chemical delivery system of the invention.

Systems and methods will be described in which the chemical manufacturer is not required to mix diluting solvents with BARC components in solution before the BARC material is shipped to the end-user. Instead, the end-user mixes the diluting solvents and BARC components himself in order to obtain desired material properties. For example, a BARC required by an end-user may include the product of a cross-linker component mixed with a polymer component and diluted in a solvent. The BARC cross-linker component is PL 1174 and p-TSA.$H_2O$ in a solution of PGME. Alternatively, the BARC cross-linker component is PL-EL, the ultimate reaction product of PL 1174 and p-TSA.$H_2O$ in a solution of PGME, in the presence of EL. The diluting solvents are kept separate from the BARC components in solution until the user introduces the diluting solvents and BARC components at the point of use. Alternatively, the user mixes the diluting solvents and BARC components in a bottle or reservoir at the point of use, and allows appropriate aging to form the cross-linker component PL-EL. In the latter alternative, the PL-EL is formed by either combining the appropriate components at room temperature and allowing enough time for the reaction to run to completion, or by artificial aging, such as by agitation. Finally, the BARC components and casting solvents are spun onto the substrate.

The system described herein uses PGME as a mixing medium for the PL 1174 and polymer components. The diluting solvents can be ethyl lactate, cyclohexanone, and PGME, added at a specific ratio to produce a BARC composition with the desired final percentage of solids and with the required coating characteristics.

Conformal BARC

Referring to FIG. 3A, a conformal BARC is formed over a substrate 10 having circuit features 12, 14 (e.g., polysilicon lines) defining a surface topography 16. A BARC 18, containing diluting solvents, e.g. ethyl lactate, and BARC components including crosslinker components as shown in FIG. 1, as well as a polymer component, such as polyvinyl phenol, is delivered to substrate 10, with the solvents and the BARC components present at an appropriate ratio. This ratio is a function of the desired viscosity and thickness. BARC 18 is spun on to substrate 10, covering features 12, 14.

Referring to FIG. 3B, enthalpy is added (step 100) to cause BARC 18 to cross-link on substrate 10. This post-coat bake 100 is performed at a temperature above the boiling point of the diluting solvents used to promote uniform spin coatings, i.e. casting solvents. The boiling point of the casting solvents EL, cyclohexanone, and PGME is approximately 154° C. The post-coat bake 100 is carried out at, e.g., 170° C. for 60 seconds. The initial stages of the bake cause the PL-PGME adduct to react with the available EL react to form PL-EL on substrate 10.

As the PL-PGME adduct transforms into PL-EL and solvent evaporates, increased shrinkage results in a conformal coating 20. Bake step 100 effectively evaporates enough solvent to sufficiently reduce the mean free distance between polymer molecules and cross-linker molecules to enable cross-linking to occur. No cross linking occurs, however, until the PL-EL cross-linker component is formed. The solvent loss during the formation of the PL-EL cross-linker causes increased shrinkage due to the evaporation which takes place prior to the initiation of the cross linking. This solvent loss creates a conformal coating.

Referring to FIG. 3C, heat is applied and a polymer resin stabilizes the BARC by cross-linking (step 200). The reaction on substrate 10 is as follows:

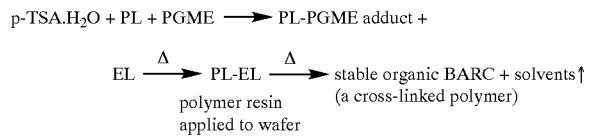

Converting the PL-PGME adduct to the PL-EL final product on substrate 10 reduces the effectiveness of the bake for the cross linking of the PL-EL and polymer. The reaction of PL 1174 with ethyl lactate, however, requires a lot of heat. The heat provided for this reaction also causes substantial amount of excess casting solvents, i.e. PGME, ethyl lactate, and cyclohexanone, to evaporate. The reaction is somewhat slow because of steric hindrance (i.e., the size and shape of the molecules necessitate heat and time to get them into the appropriate location). As the solvents are driven off, the ethyl lactate and PL 1174 molecules get closer to each other, and the provided heat increases the kinetic energy of the molecules. A reaction between ethyl lactate and protonated PL 1174 then takes place. Heat is needed both to form the PL-EL cross-linker on the substrate 10 and also to cross-link the polymer.

A conformal coating is normally desirable for better optical performance. BARC 18 is not completely opaque with respect to actinic light, i.e. light of an appropriate wavelength which causes desired photochemistry to occur, on substrate 10. A conformal coating, therefore, provides a uniform optical thickness and reflectivity across substrate 10 because the BARC thickness is uniform. In accordance with the process described above, conformal coverage is obtained when the BARC cross-linker component is brought to the point-of-use containing primarily the PL-PGME adduct, and the PL-EL cross-linker having not yet been formed. Conformal coverage is achieved by casting a very low viscosity and high molecular weight material across the whole wafer. As the solvents are evaporated, the material shrinks to form a conformal coating over the underlying topography when no thermal reflow occurs. The solvents are driven off to form a dense film that mimics the topography of the underlying substrate. This process enables a shrinkage of a coating, for a given high molecular weight material, controllable by varying the process parameters as well as the viscosity of the material.

Planarizing BARC

Referring to FIG. 4A, in certain applications, a planarizing anti-reflective coating 22 is needed to planarize a surface 11 of a substrate 10 having topography 16 defined by circuit features 12, 14. Planarization is facilitated by early cross linking of a cross linker, such as PL-EL and a polymer component. Thus, a BARC solution 24 containing PL-EL is spun on to substrate 10. Substrate 10 is subjected to a bake step of, e.g., 170° C. for 60 seconds. The existence of the PL-EL cross linker allows the bake energy to directly accelerate solvent evaporation and cross linking. The solvent evaporates from surface 26 of the material. Thereby, the PL-EL cross linker and the polymer component cross link sooner than would be the case if PL-EL had not yet been formed. The cross linking sets the shape of the film surface. Referring to FIG. 4B, the result is a planarizing coating 22. The reaction on substrate 10 is as follows:

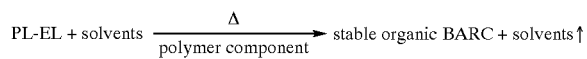

More specifically, the initial process of adding heat to substrate 10 densities a surface 26 of BARC 24. The PL-EL and polymer molecules at surface 26 come into contact quickly and set the surface nearly as it was coated, with very little shape changes. Once the surface skin is formed by cross-linking, the shape does not change, it is dense, and there is no further loss of thickness. Hence, one obtains a planarizing coating for a low molecular weight where thermal reflow occurs.

In the planarizing BARC process, the reaction of cross-linking the polymers to one another through the powder link in PL-EL is a much quicker reaction than the conformal BARC process, in which PGME in the PL-PGME adduct has to be replaced with ethyl lactate Steric hindrances reduce the rate of the latter reaction. PL-EL, thereby, goes to a cross-linked final product much more easily than PL-PGME goes from PL-PGME to PL-EL to cross-linked product.

A planarizing BARC coating is desirable, for example, in a case where one needs to selectively remove a portion or given thickness of an underlying layer, to expose some topographical features. Planarizing coatings can also be used to fill holes, thereby facilitating further lithographic or etching steps.

Referring to FIG. 5, a system 300 for enabling the formation of both planarizing and conformal anti-reflective coatings from the same starting materials is shown. System 300 includes a vessel 310 for holding BARC components, e.g. a cross-linker component and a polymer component. System 300 also includes a vessel 320 containing solvents, e.g. ethyl lactate and cyclohexanone. A pump 330 transfers BARC components from vessel 310 to a mixing vessel 340 through tube 350. Similarly, a pump 360 transfers solvents from vessel 320 to mixing vessel 340 through a tube 370. The BARC components and solvents are mixed thoroughly, at a selected ratio, in mixing vessel 340. According to a user specification, the resulting mixture is directed by a valve 380 to a path 390 to form a conformal coating, or to a path 400 to form a planarizing coating.

The product, as it emerges from mixing vessel 340, is in a form suitable for producing a conformal coating which has very little via fill. At that point, it has a relatively high amount of PL-PGME adduct and very little PL-EL. The product flows along path 390 towards pump 410. Pump 410 pumps the product through a tube 420 and on to a substrate 430, to form a conformal coating. A temperature-stabilizing jacket 435 is wrapped around tube 420 to ensure process reliability and repeatability.

Alternatively, the product is transferred to path 400 and heated for an appropriate time and temperature to age in the material, causing the characteristics of the material to change. In this case, the change results in a planarizing coating which has nearly complete via filling capability. More specifically, the product, after entering path 400, flows through a high temperature heat exchanger 440. Heat exchanger 440 is electrically connected to a heater 450. Heat exchanger 440 is set to an appropriate temperature, so that the product is altered to have the desired characteristics, e.g. a high ratio of PL-EL to PL-PGME. After the product is adequately aged, it is pumped by a pump 460 through tubes 470, 480. Tubes 470, 480 are wrapped with temperature-stabilizing jackets 490, 500. Jacket 490 cools the material to an appropriate working temperature, after the material has aged at a high temperature. The product passes through tube 480 to substrate 430 to form a planarizing coating. Temperatures, quantities, and flows at all process steps must be accurately controlled in order to effect the required changes in material characteristics.

Figure 6A:
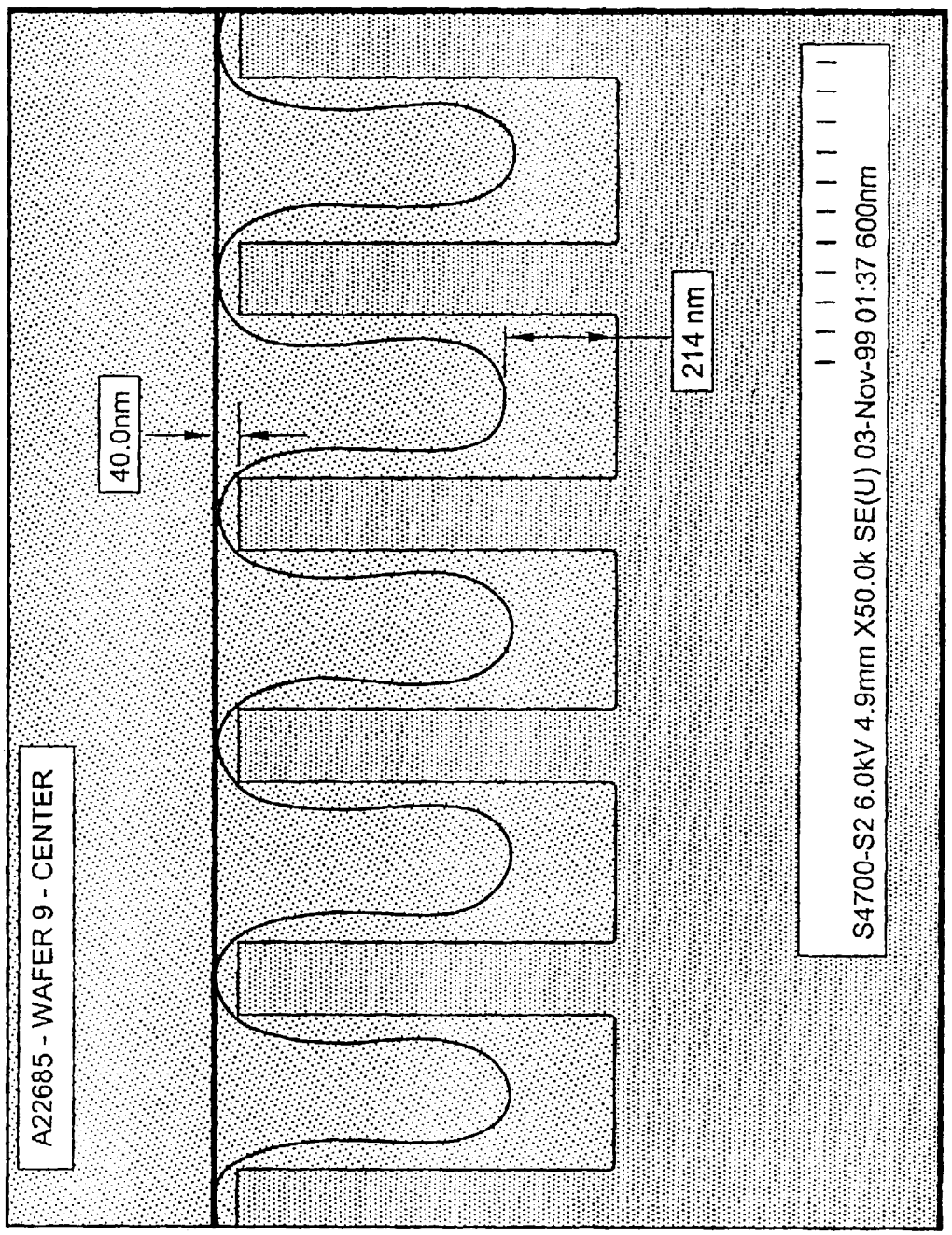
FIGS. 6A–6D are micrographs of substrates with anti-reflective coatings, with varying degree of conformality.
Figure 6B:
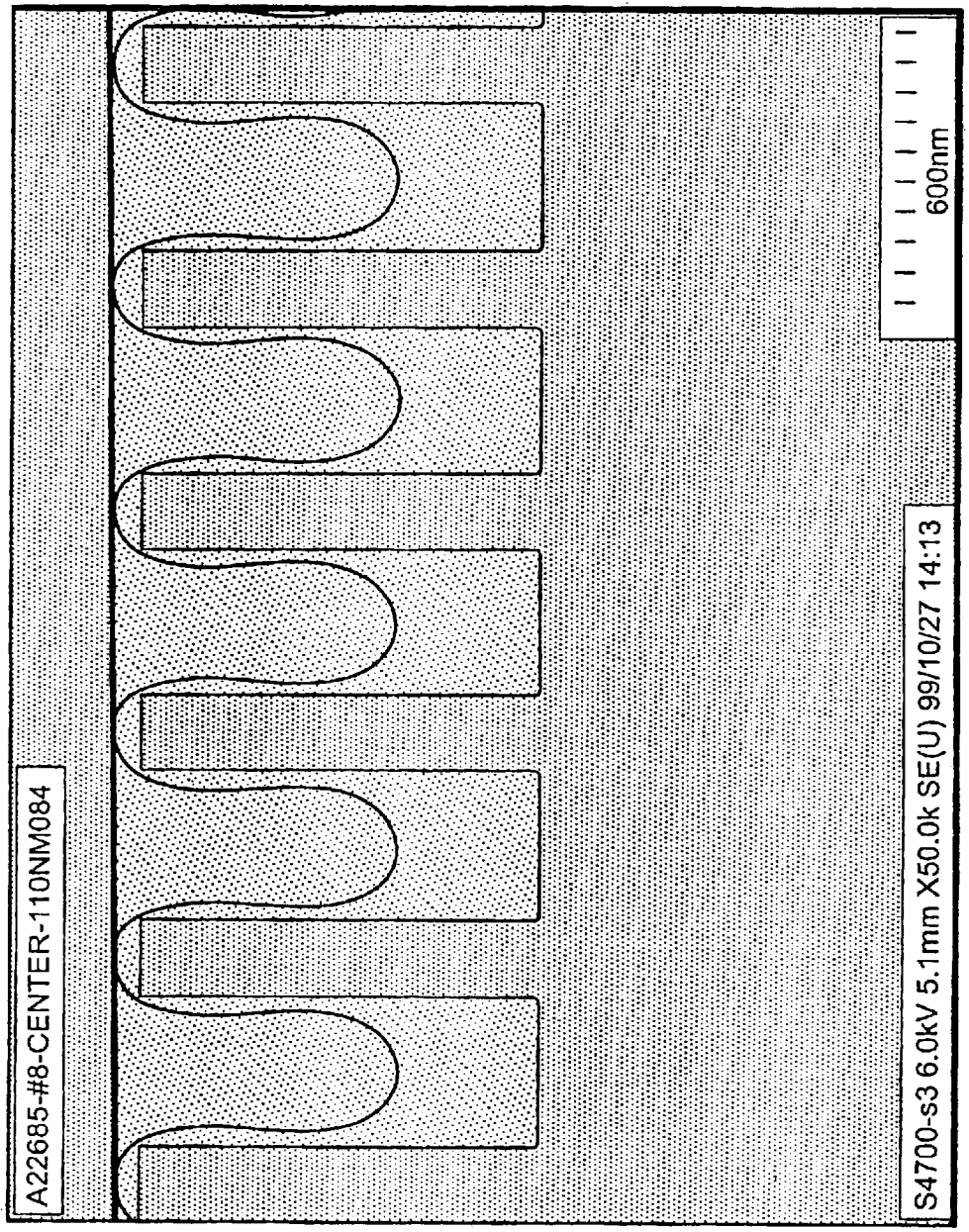
Figure 6C:
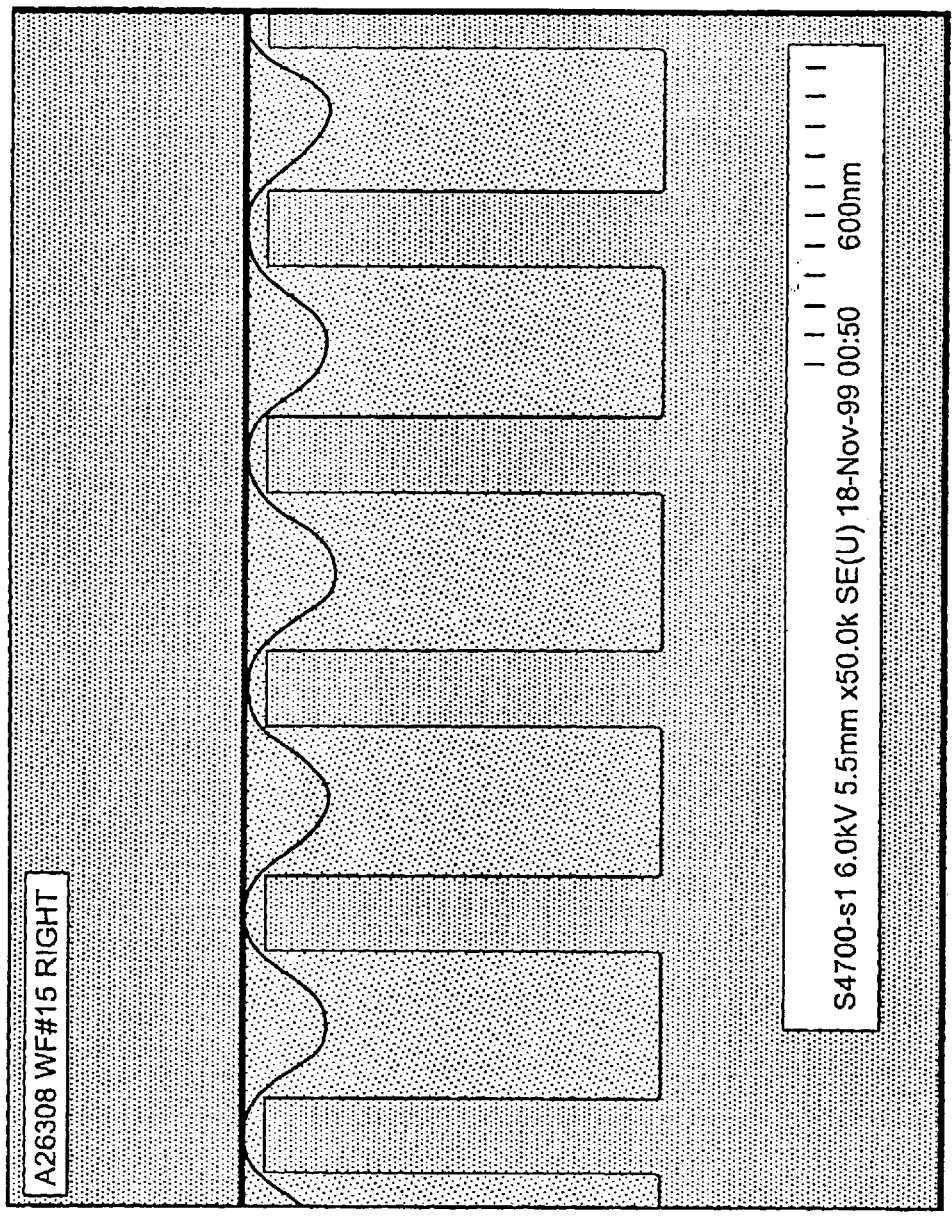
Figure 6D:
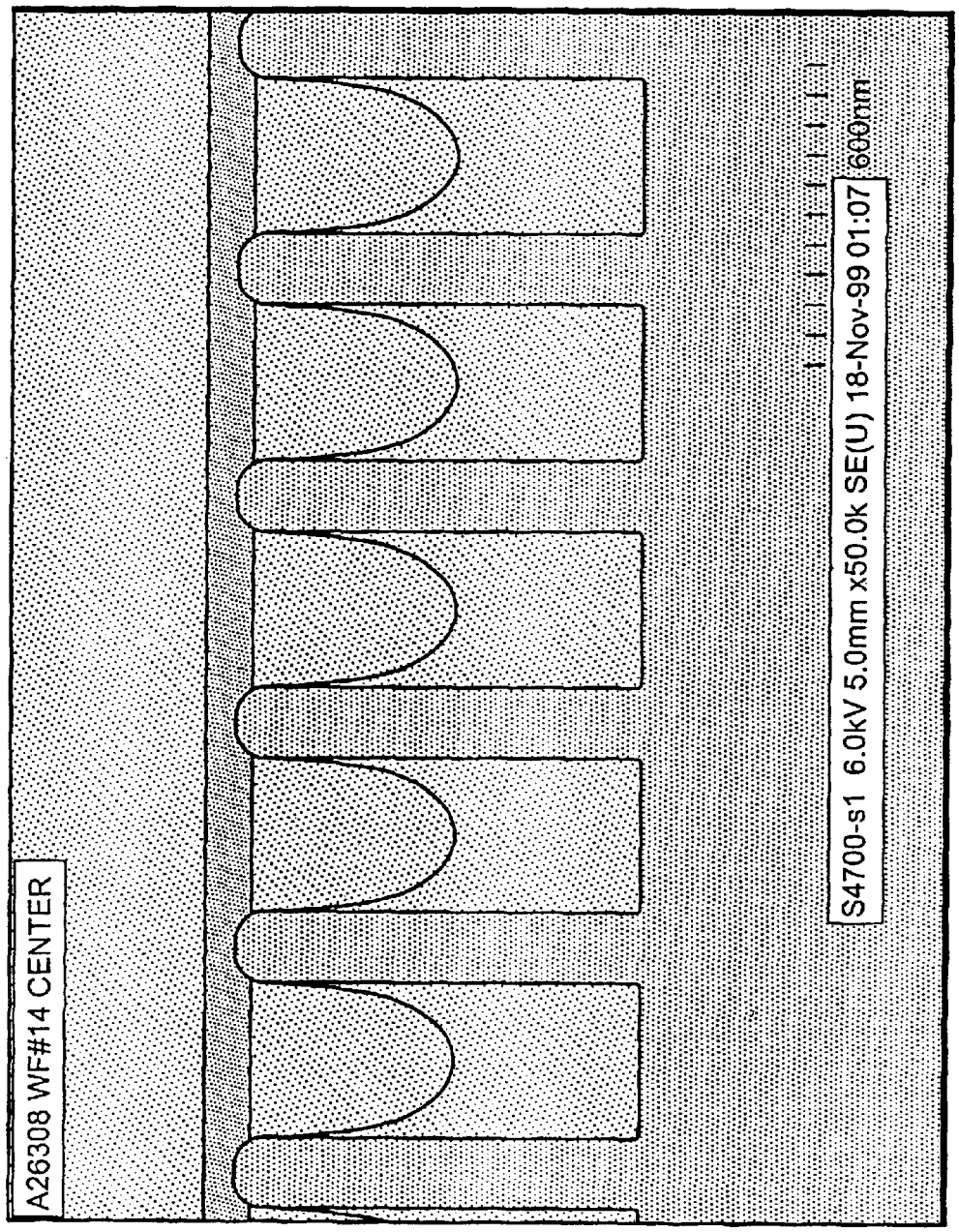

Referring to FIGS. 6A–6D, aging of BARC affects via filling and planarity. In FIGS. 6A and 6B, at time 0, one has a conformal coating with poor via filling. As shown in FIG. 6C, a higher viscosity material forms a planarizing coating, after aging at room temperature for 21 days. Referring to FIG. 6D, aging a lower viscosity material, at room temperature for 21 days results in a coating transitioning from conformal to planarizing.

The effect of aging in can be accelerated. The effect illustrated in FIGS. 6A–6D can be seen at 1 hour with 60° C., or sooner at even higher temperatures. The option of accelerated aging allows one the opportunity to produce coatings which are either planarizing or conformal and can either fill vias to a high degree or to a lesser extent. As explained above, the reaction which controls the mechanism is initiated with the addition of the solvent system, a diluting medium, to the BARC components. Increasing the temperature increases the reaction rate and accelerates the aging.

A number of embodiments of the invention have been described. Nevertheless, it will be understood that various modifications may be made without departing from the spirit and scope of the invention. For example, the BARC components and solvents can be mixed through circulation or through other appropriate mixing methods. This procedure could be used to control many of the needed characteristics of chemistries used in the lithographic process by adapting the inherent properties or characteristics of a material through variations in quantities, times, temperatures, etc. Characteristics to be controlled could be via fill percentage, conformality, optical density, viscosity, and thickness. Further, the chemical product can be delivered to the substrate by various means other than a pump, such as by means of pressurized vessels, etc. The method of the invention can be used not only with BARC but also with various organic lithographic materials, such as spin-on glass or photoresist films. The method is appropriate to use with any material which has components which interact over time. Other materials, like spin-on-glass or photoresist films, may have other properties which have to be controlled, such as photospeed, ability to absorb other materials, like silation agents, or dielectric constants. The invention can be applicable to these materials, too. If one knows the mechanism by which the molecules are reacting, one can control the reaction and the characteristics at the final point of use.

Accordingly, other embodiments are within the scope of the following claims.

What is claimed is:

1. A method for forming an anti-reflective coating on a semiconductor substrate, comprising:
   providing a first vessel containing an anti-reflective coating component;
   providing a second vessel containing a solvent;
   supplying the anti-reflective coating component from the first vessel and the solvent from the second vessel to a mixing chamber;
   mixing the anti-reflective coating component and the solvent in the mixing chamber to form a product;
   transferring the product to the semiconductor substrate; and
   applying the product to the semiconductor substrate to form the anti-reflective coating, wherein the anti-reflective coating is a conformal coating.

2. The method of claim 1, wherein the anti-reflective coating has a degree of conformality and the degree of conformality is controlled by controlling a time between mixing the anti-reflective coating component and the solvent.

3. The method of claim 1, further comprising heating the product before transferring the product to the substrate.

4. The method of claim 3, wherein the anti-reflective coating has a degree of conformality and the degree of conformality is controlled by the heating of the product before transferring the product to the substrate.

5. The method of claim 1, wherein the product is transferred to the semiconductor substrate by a pump.

6. The method of claim 1, further comprising the step of aging the product to control a degree of conformality of the anti-reflective coating.

7. A method for forming an anti-reflective coating on a semiconductor substrate, comprising:
   providing a first vessel containing an anti-reflective coating component;
   providing a second vessel containing a solvent;
   supplying the anti-reflective coating component from the first vessel and the solvent from the second vessel to a mixing chamber;
   mixing the anti-reflective coating component and the solvent in the mixing chamber to form a product;
   transferring the product to the semiconductor substrate; and
   applying the product to the semiconductor substrate to form the anti-reflective coating, wherein the anti-reflective coating is a planarizing coating.

8. The method of claim 7, further comprising heating the product before transferring the product to the substrate.

9. The method of claim 8, wherein the anti-reflective coating has a degree of planarization and the degree of planarization is controlled by the heating of the product before transferring the product to the substrate.

10. The method of claim 7, further comprising the step of aging the product to control a degree of planarization of the anti-reflective coating.

11. The method of claim 7, wherein the product is transferred to the semiconductor substrate by a pump.

12. A system for forming an anti-reflective coating on a semiconductor substrate comprising:

- a first vessel for containing an anti-reflective coating component;
- a second vessel for containing a solvent;
- a mixing chamber for mixing the anti-reflective coating component with the solvent to form a product; and
- a fluid transport system connecting the mixing chamber and the substrate for supplying the product from the mixing chamber to the semiconductor substrate to form the anti-reflective coating.

13. The system of claim 12, wherein the anti-reflective coating is a conformal coating.

14. The system of claim 12, wherein the anti-reflective coating is a planarizing coating.

15. The system of claim 12, wherein the same anti-reflective coating component and solvent is used to form the coating, wherein the coating is selected from the group of coatings consisting of planarizing and conformal anti-reflective coatings.

16. The system of claim 12, further comprising a heat exchanger for heating the product before transferring the product to the substrate.

17. The system of claim 12, further comprising a pump for transferring the product to the semiconductor substrate.

18. A method for forming an anti-reflective coating on a semiconductor substrate comprising:

- providing an anti-reflective coating component;
- providing a solvent;
- mixing the anti-reflective coating component with the solvent at a ratio to form a product with a desired viscosity; and
- coating the semiconductor substrate with the product to form the anti-reflective coating,
- wherein the semiconductor substrate is coated with the product at a predetermined time after the product is formed.

19. The method of claim 18, wherein the coating is a conformal coating.

20. The method of claim 18, further comprising heating the product before coating the substrate with the product to form a planarizing coating.

* * * * *